United States Patent
Tokumine

(10) Patent No.: US 7,518,243 B2
(45) Date of Patent: Apr. 14, 2009

(54) SEMICONDUCTOR DEVICE WITH MULTILAYER INTERCONNECTION STRUCTURE

(75) Inventor: Yoshitake Tokumine, Kanagawa (JP)

(73) Assignee: NEC Electronics Corporation, Kawasaki, Kanagawa (JP)

( * ) Notice: Subject to any disclaimer, the term of this patent is extended or adjusted under 35 U.S.C. 154(b) by 378 days.

(21) Appl. No.: 11/070,165

(22) Filed: Mar. 3, 2005

(65) Prior Publication Data

US 2005/0194679 A1    Sep. 8, 2005

(30) Foreign Application Priority Data

Mar. 4, 2004   (JP)   ............... 2004-061164

(51) Int. Cl.
*H01L 23/48*   (2006.01)
*H01L 23/52*   (2006.01)
*H01L 29/40*   (2006.01)

(52) U.S. Cl. ...................... 257/758; 257/750

(58) Field of Classification Search .......... 257/E21.575, 257/E21.641, E21.627, 750, 758
See application file for complete search history.

(56) References Cited

U.S. PATENT DOCUMENTS 4,324,038 A * 4/1982 Chang et al. ................. 438/282
4,657,628 A * 4/1987 Holloway et al. ............ 438/647

2003/0157794 A1   8/2003 Agarwala et al.
2004/0061231 A1 * 4/2004 He et al. ...................... 257/758

FOREIGN PATENT DOCUMENTS

JP    4-38852    2/1992

OTHER PUBLICATIONS

Chinese Office Action dated Feb. 2, 2007, with English translation.

* cited by examiner

*Primary Examiner*—Matthew Smith
*Assistant Examiner*—Candice Y Chan
(74) *Attorney, Agent, or Firm*—McGinn IP Law Group, PLLC

(57) ABSTRACT

A semiconductor device with a multilayer interconnection structure comprises a semiconductor substrate, a plurality of metal wiring layers provided on the semiconductor device and electrically insulated from the upper and lower layers by an interlayer insulation film, and via holes penetrating through the interlayer insulation film and connecting the wirings of the first metal wiring layer and the second metal wiring layer positioned above the first metal wiring layer. And, potential of predetermined wiring of the first metal wiring layer is electrically floating from the semiconductor substrate, and a capacitance value between the wiring of the first metal wiring layer and the semiconductor substrate per one via provided on the predetermined wiring of the first metal wiring layer is a predetermined value or less. Thereby, in the semiconductor device with a multilayer interconnection structure comprising a plurality of metal wiring, a conduction failure caused by a high resistance layer which can be created at the time of via formation can be reduced.

17 Claims, 12 Drawing Sheets

SEMICONDUCTOR DEVICE WITH MULTILAYER INTERCONNECTION STRUCTURE

BACKGROUND OF THE INVENTION

1. Technical Field of the Invention

The present invention relates to a semiconductor device with a multilayer interconnection structure comprising a plurality of wiring layers which are interconnected, between the wiring layers, by via holes provided in an interlayer insulation film.

2. Description of the Related Art

In a semiconductor device with a multilayer interconnection structure, it is necessary to connect a lower-layer wiring and an upper-layer wiring by forming via holes in an interlayer insulation film.

FIG. 1 shows a general via structure of a conventional semiconductor device. Wiring 100 is formed on a lower-layer interlayer insulation film 1. This wiring 100 is composed of a lower barrier metal 2 formed on the interlayer insulation film 1, metal wiring (AlCu) 3 formed on the lower barrier metal 2, and an upper barrier metal 4 formed on the metal wiring 3. The lower barrier metal 2 consists of a Ti layer 2a and a TiN layer 2b. The upper barrier metal 4 consists of a Ti layer 4a and a TiN layer 4b. This wiring 100 is buried in an interlayer insulation film 6 formed on the lower-layer interlayer insulation film 1.

A part of the interlayer insulation film 6 that is directly on the upper barrier metal 4 is removed including a part of the upper barrier metal 4, whereby a via hole is formed. Then, by filling a metal (such as tungsten) in this via hole, a via 5 is formed. The via 5 is connected to wiring (unillustrated) formed on the interlayer insulation film 6.

Here, the following description is given with the lower barrier metal 2 of the metal wiring 100 as being a structure of the TiN layer 2b laminated on the Ti layer 2a, however, as shown in FIG. 2, the lower barrier metal may be a single layer of the TiN layer 2b.

For the wiring 100 and via 5 of the above-described structure, in a case where wiring (unillustrated) buried in the lower-layer interlayer insulation film 1 directly under the wiring 100 is metal wiring having a large area and in a floating state or the wiring 100 is connected to a large-capacity MOS transistor gate electrode directly or by other wiring, electric charge is easily accumulated in the metal wiring 3, therein exists a problem. In this case, a high resistance layer is easily formed on the surface layer of the upper barrier metal 4 when a via hole is formed in the interlayer insulation film 6. If a high resistance layer is formed on the surface layer of the upper barrier metal 4, conduction between the wiring (unillustrated) formed on the interlayer insulation film 6 and wiring 100 fails.

Since a conduction failure of the via 5 is hardly found by an inspection during manufacturing, it is necessary to prevent this from occurring in the structure.

As a prior art to prevent disconnection at a via-hole portion in a semiconductor device having a multilayer interconnection, one described in Japanese Published Unexamined Patent Application No. H04-38852 exists. For a conventional semiconductor device having multilayer wiring described in this Japanese Published Unexamined Patent Application No. H04-38852, conduction between upper-layer wiring and lower-layer wiring is secured by connecting the upper-layer wiring and lower-layer wiring by a plurality of vias (through-hole portions)

However, the prior art disclosed in Japanese Published Unexamined Patent Application No. H04-38852 is for preventing disconnection caused by a physical force produced by an influence of heat distortion and the like, and no consideration has been given to a conduction failure which is caused by a high resistance layer created at the time of via formation in the above.

Namely, in the above-described prior art, since no measure to suppress creation of a high resistance layer has been taken, even when a plurality of via holes are formed, a high resistance layer may be formed on all thereof to produce a conduction failure.

As such, the conventional semiconductor device with a multilayer interconnection structure has had a problem such that a high resistance layer is created when via holes are formed on metal wiring and this can cause a conduction failure.

SUMMARY OF THE INVENTION

It is an object of the present invention to reduce, in a semiconductor device with a multilayer interconnection structure comprising a plurality of metal wiring layers, a conductive failure caused by a high resistance layer which can be created at the time of via formation.

A semiconductor device with a multilayer interconnection structure according to a first aspect of the present invention comprises a semiconductor substrate, a plurality of metal wiring layers provided on the semiconductor substrate and electrically insulated from upper and lower metal wiring layers by an interlayer insulation film between them, and at least one via penetrating through the interlayer insulation film and connecting a metal wiring of a first metal wiring layer and a metal wiring of a second metal wiring layer positioned above the first metal wiring layer. This semiconductor device with a multilayer interconnection structure has a feature that potential of predetermined wiring of the first metal wiring layer is electrically floating from the semiconductor substrate, and a capacitance value between the predetermined wiring of the first metal wiring layer and semiconductor substrate per one via provided on the predetermined wiring of the first metal wiring layer is a predetermined value or less.

In any construction of the first aspect of the present invention, it is preferable that the first metal wiring layer has a barrier metal at a top thereof, and in addition hereto, it is more preferable that the via and the wiring of the first metal wiring layer are connected by the barrier metal.

In addition, a semiconductor device with a multilayer interconnection structure according to a second aspect of the present invention has a feature that, in addition to the semiconductor device with a multilayer interconnection structure according to the first aspect of the present invention, the predetermined wiring of the first metal wiring layer is connected to a gate electrode, and the predetermined value is almost equal to a capacitance value between the gate electrode and semiconductor substrate per one via provided on the predetermined wiring of the first metal wiring layer. In this second aspect of the invention, it is preferable that the predetermined value is 8 pF.

In any construction of the second aspect of the present invention, it is more preferable that the predetermined value is a value to reduce-via conduction failure. Moreover, in any construction of the second aspect of the invention, it is preferable that the wiring of the first metal wiring layer has a barrier metal at a top thereof, and in addition hereto, it is more preferable that the via and the wiring of the first metal wiring layer are connected via the barrier metal.

In addition, in order to achieve the object, the present invention provides, as a third aspect, a semiconductor device with a multilayer interconnection structure characterized in that, in addition to the second aspect of the present invention, third metal wiring layer is further provided on the second metal wiring layer via an interlayer insulation film, the wiring of the second metal wiring layer and the third metal wiring layer are connected by at least one second via, predetermined wiring of the second metal wiring layer is connected to only predetermined wiring of the first metal wiring layer connected to a gate electrode, and a capacitance value between the gate electrode connected via the first metal wiring layer to the predetermined wiring of the second metal wiring layer and semiconductor substrate per one second via provided on the predetermined wiring of the second metal wiring layer is the predetermined value or less. In the third aspect of the present invention, it is preferable that the predetermined value is 8 pF.

In any construction of the third aspect of the present invention, it is preferable that the predetermined value is a value to reduce via conduction failure.

In any construction of the third aspect of the present invention, it is preferable that the first metal wiring layer has a first barrier metal at a top of the wiring thereof, and the second metal wiring layer has a second barrier metal at a top of the wiring thereof. In addition hereto, it is more preferable that the via and the wiring of the first metal wiring layer are connected via the first barrier metal, and the second via and the wiring of the second metal wiring layer is connected via the second barrier metal.

In addition, in order to achieve the object, the present invention provides, as a fourth aspect, a semiconductor device with a multilayer interconnection structure characterized in that, in addition to the first aspect of the present invention, the predetermined wiring of the first metal wiring layer is connected to only the via for a connection to the second wiring layer, the predetermined value is dominated by an area of the predetermined wiring of the first metal wiring layer per one via provided on the predetermined wiring of the first metal wiring layer per one via provided on the predetermined wiring of the first metal wiring layer, and the area of the predetermined wiring of the first metal wiring layer per one via provided on the predetermined wiring of the first metal wiring layer is a predetermined value or less. In the fourth aspect of the invention, it is preferable that the predetermined value is 2500 μm².

In any construction of the fourth aspect of the present invention, it is preferable that the predetermined value is a value to reduce via conduction failure. Moreover, in any construction of the fourth aspect, the first metal wiring layer has a barrier metal at a top of the wiring thereof, and in addition hereto, it is more preferable that the via and the wiring of first metal wiring layer are connected via the barrier metal.

According to the present invention, in a semiconductor device with a multilayer interconnection structure comprising a plurality of metal wiring, a conductive failure caused by a high resistance layer which can be created at the time of via formation can be reduced.

DETAILED DESCRIPTION OF THE PREFERRED EMBODIMENTS

First, a principle of the present invention will be described. When upper wiring and lower wiring are connected by via holes in a semiconductor device with a multilayer interconnection structure, if sectional areas of the respective via holes are uniform, the total of the contact areas between the via holes and wiring is proportional to the number of via holes.

Figure 1:
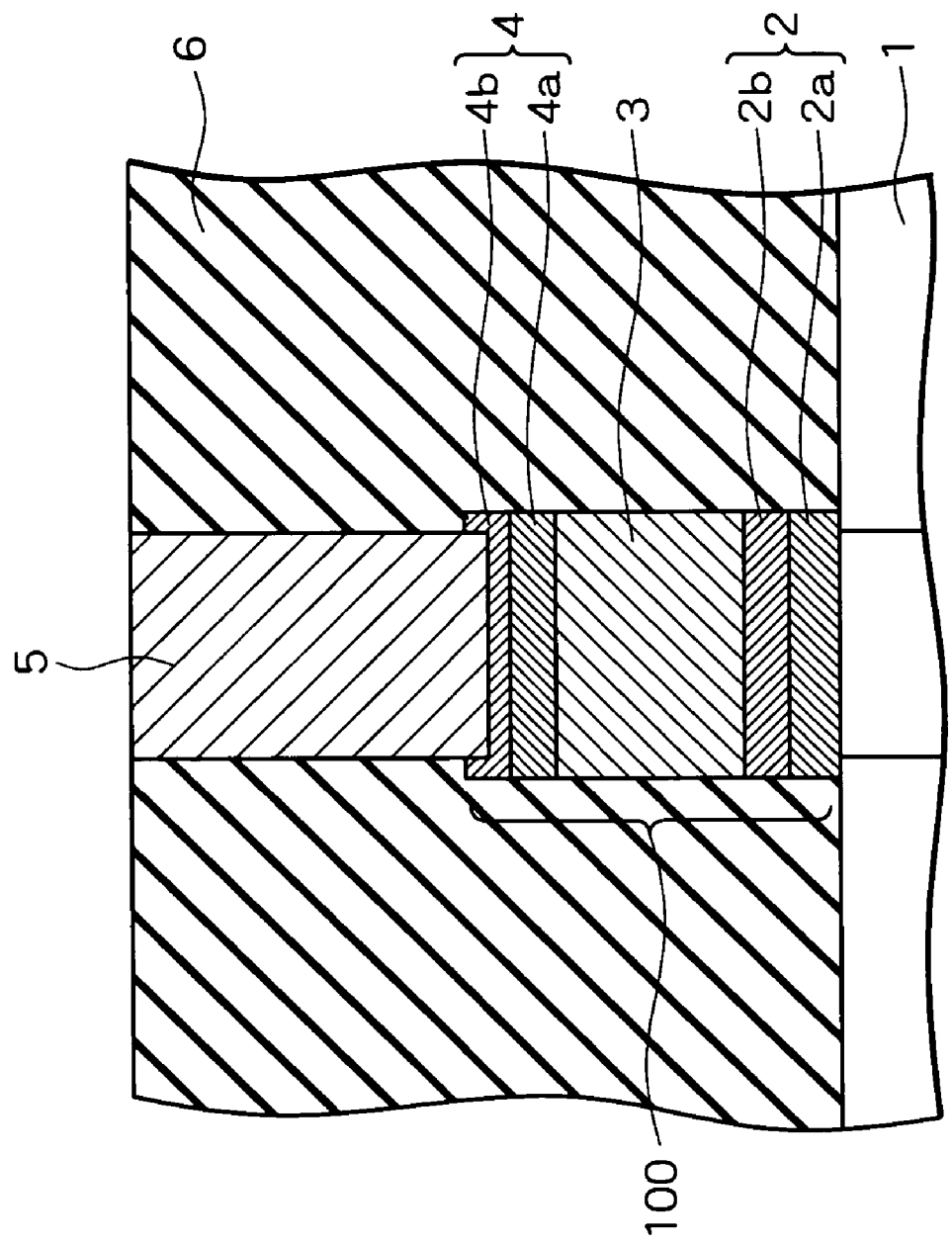
FIG. 1 is a view showing a detailed structure of a metal wiring and a via formed thereon.
Figure 2:
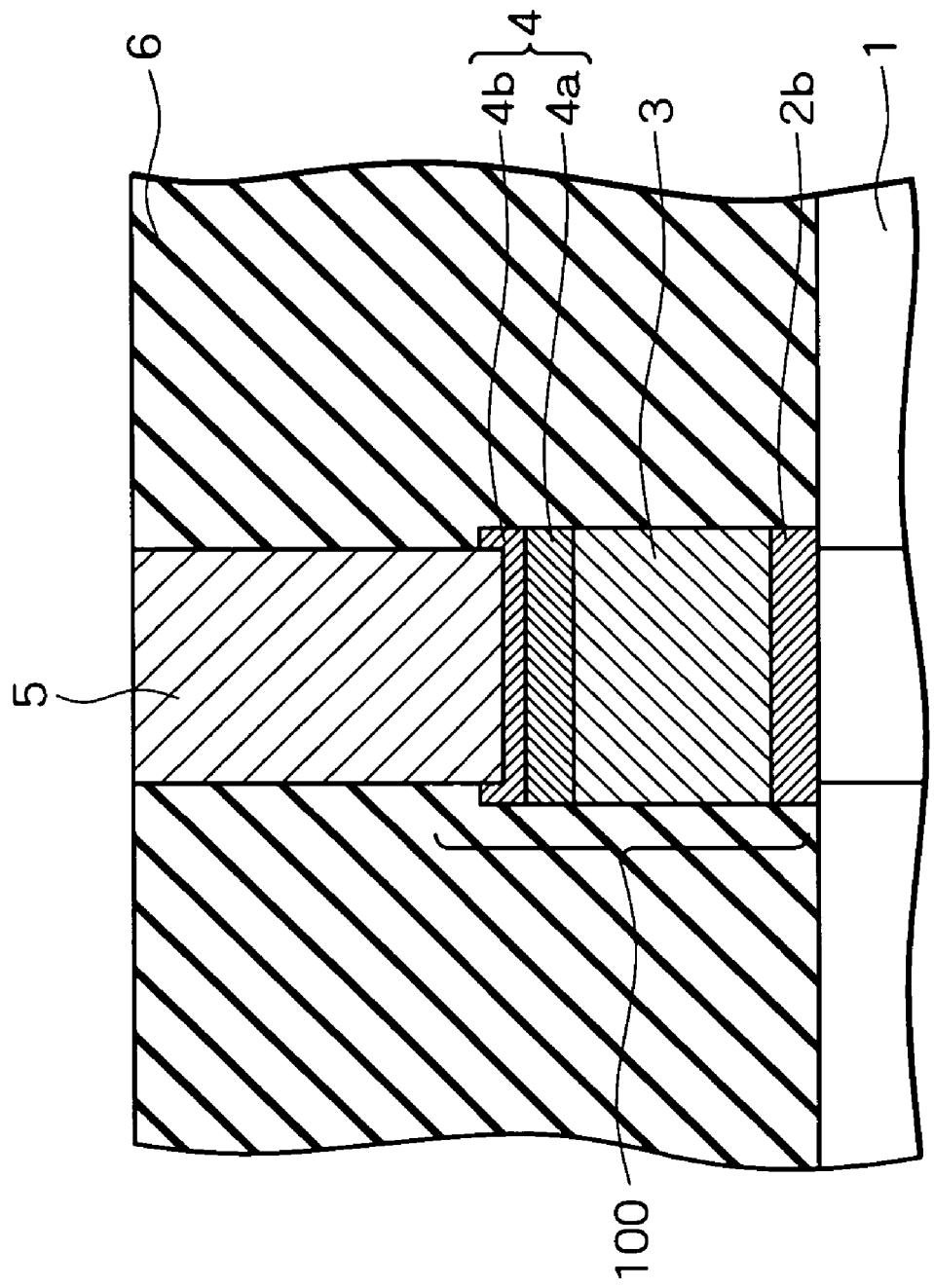
FIG. 2 is a view showing a detailed structure of a metal wiring and a via formed thereon.
Figure 3:
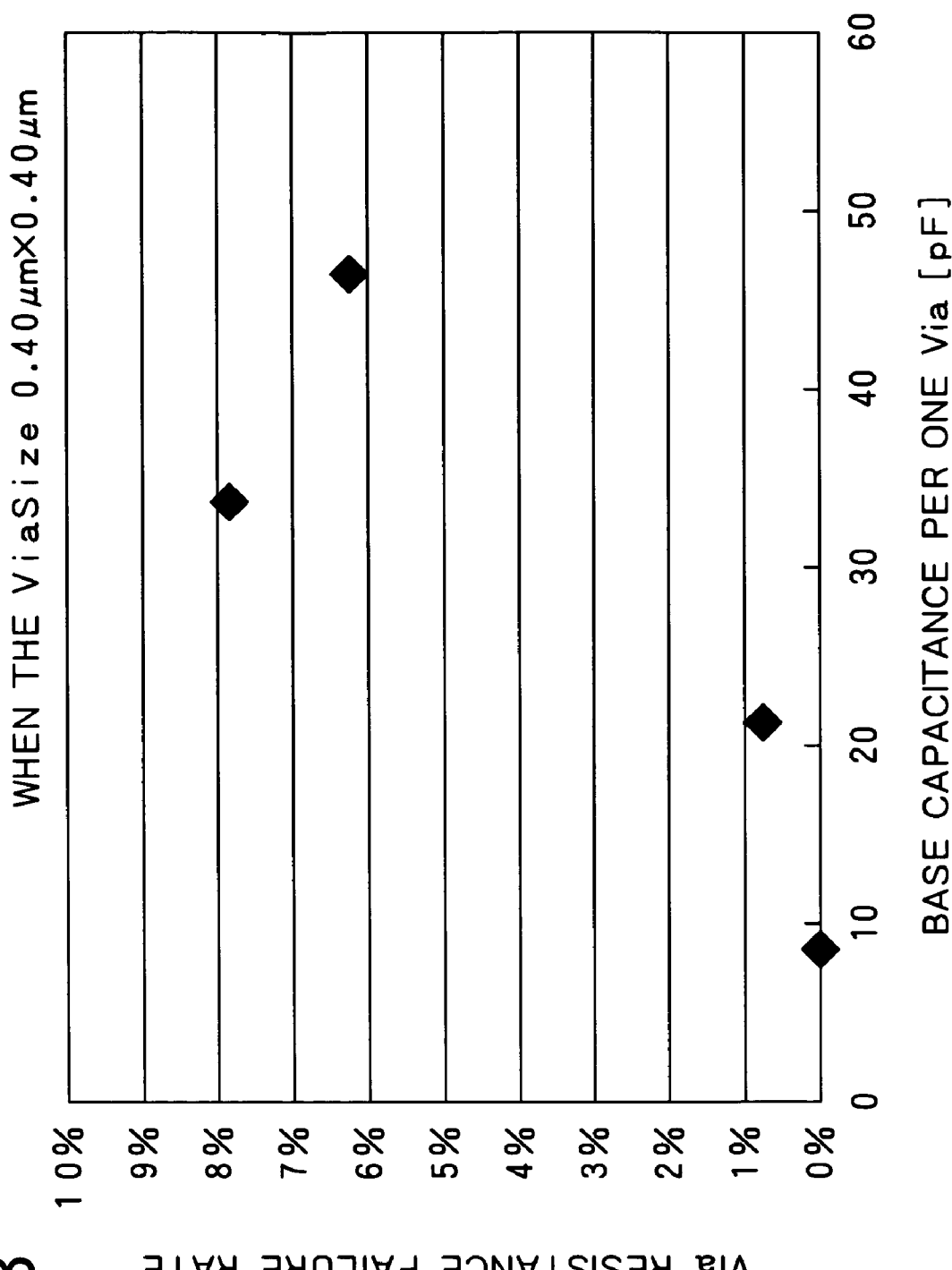
FIG. 3 is a chart showing an example of a relationship between the number of via holes formed on a large-capacity electrode and conduction failure occurrence rate between the upper and lower wiring.

FIG. 3 is a chart showing an example of a relationship between the number of via holes formed on wiring connected to a large-area gate electrode and conduction failure occurrence rate between the upper and lower wiring. The horizontal axis of FIG. 3 shows a value (pF) of capacitance (base capacitance) between the gate electrode and semiconductor substrate per one via, and the longitudinal axis shows a failure occurrence rate (%). Here, a via section is a regular square of approximately 0.4 μm×0.4 μm in design. In actuality, it becomes a circle with a diameter of approximately 0.4 μm after manufacturing.

According to FIG. 3, if a capacitance value between the gate electrode and semiconductor substrate per one via, that is, a value obtained by dividing a capacitance value between the gate electrode and semiconductor substrate by the number of via holes is 8 pF or less, a failure rate of via resistance is 0%. Accordingly, it is understood that no conduction failure has occurred between the upper and lower wiring layers and no high resistance layer is created on the surface layer of the upper barrier metal. In addition, if the capacitance value between the gate electrode and semiconductor substrate per one via exceeds 8 pF, it is confirmed that a conduction failure has occurred between the wirings of the upper and lower wiring layers and a high resistance layer has been created.

Therefore, in such a case, the number of via holes is set so that the capacitance value between the gate electrode and semiconductor substrate per one via does not exceed 8 pF.

Figure 4:
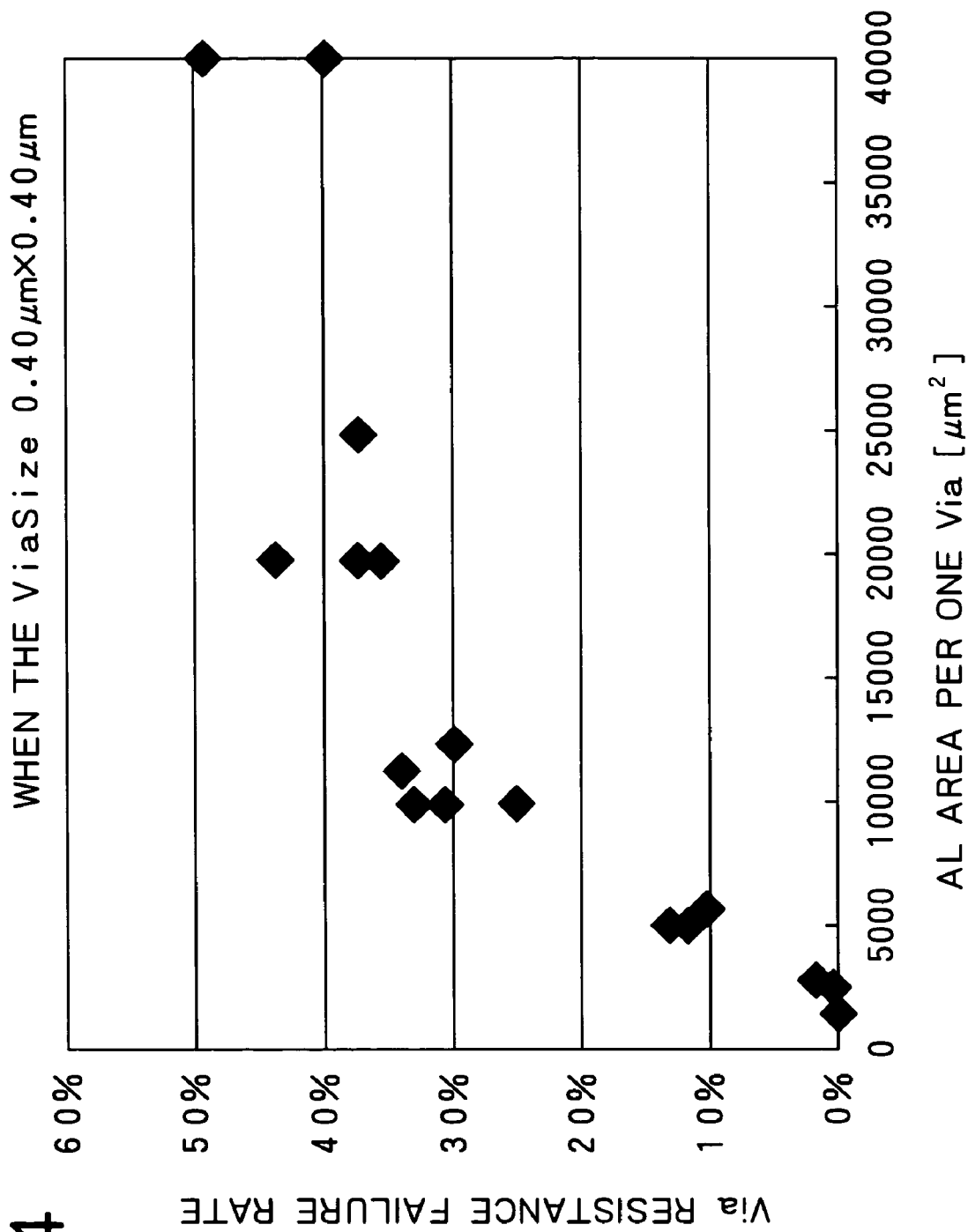
FIG. 4 is a chart showing an example of a relationship between the number of via holes formed on metal wiring in a floating state and failure occurrence rate.

In addition, FIG. 4 shows an example of a relationship between the number of via holes formed on metal wiring in a floating state and failure occurrence rate. In FIG. 4, the horizontal axis shows an area ($\mu m^2$) of metal wiring in a floating state per one via, and the longitudinal axis shows a failure occurrence rate (%). Here, a via section is a regular square of approximately 0.4 $\mu m \times 0.4$ $\mu m$ in design, and an actual condition thereof after manufacturing is a circle with a diameter of approximately 0.4 $\mu m$.

According to FIG. 4, if an area of metal wiring in a floating state per one via, that is, a value obtained by dividing an area of metal wiring in a floating state by the number of via holes is 2500 $\mu m^2$ or less, it is understood that no conduction failure has occurred between the wirings of the upper and lower wiring layers and no high resistance layer is created on the surface layer of the upper barrier metal of the wiring of the lower wiring layer. In addition, if the area of metal wiring in a floating state per one via exceeds 2500 $\mu m^2$, it is understood that a conduction failure has occurred between the wirings of the upper and lower wiring layers and a high resistance layer has been created.

Therefore, in such a case, the number of via holes is set so that the area of metal wiring in a floating state per one via does not exceed 2500 $\mu m^2$.

Electric charge accumulated in metal wiring in a floating state during a semiconductor device manufacturing process is determined depending on the area of the metal wiring. Accordingly, in either case where the wiring of the lower metal wiring layer is connected to a gate electrode and where the wiring of the lower metal wiring layer is in a floating state, by providing an electric charge per one via at a predetermined value or less, creation of a high resistance layer on the surface layer of the upper barrier metal can be suppressed at the time of via formation.

Accordingly, in a case where the gate electrode is divided in plurality, even if no high resistance layer is formed at the time of via formation when the respective gate electrodes are insulated, a high resistance layer may be formed after the plurality of gate electrodes are connected. Accordingly, in the present invention, a wiring structure is employed so that the respective gate electrodes are brought into an insulated condition at a stage where metal wiring to be a confluence of electric currents from the respective gate electrodes is formed and the plurality of gate electrodes are electrically connected when metal wiring of an upper layer compared therewith is formed. By connecting the respective gate electrodes as such, creation of a high resistance layer can be suppressed at the time of via formation.

In such a manner, creation of a high resistance layer can be suppressed at the time of via formation, and not only can a conducting pathway be secured, when any via fails in conduction, by way of another via, but also creation of a high resistance layer itself can be suppressed. Namely, conduction between the upper and lower wiring is secured, and reliability of the semiconductor device is improved.

Here, for the sake of simplification of description, a description has been herein given by raising, as an example, a case where all via holes have an identical sectional area, and a capacitance value between the gate electrode and semiconductor substrate per one via and an area of metal wiring in a floating state per one via are taken into consideration, however, all via holes do not necessarily have an identical sectional area, and via holes different in sectional areas may be mixed. In other words, in terms of a via which is the greatest in electric capacitance between the electrode and semiconductor substrate per unit area or in the area of metal wiring in a floating state, it is sufficient that the value (an electric capacitance or area per unit area) thereof is a predetermined value or less.

Hereinafter, preferred embodiments of the present invention based on the above-described principle will be described in detail.

First Embodiment

Figure 5:
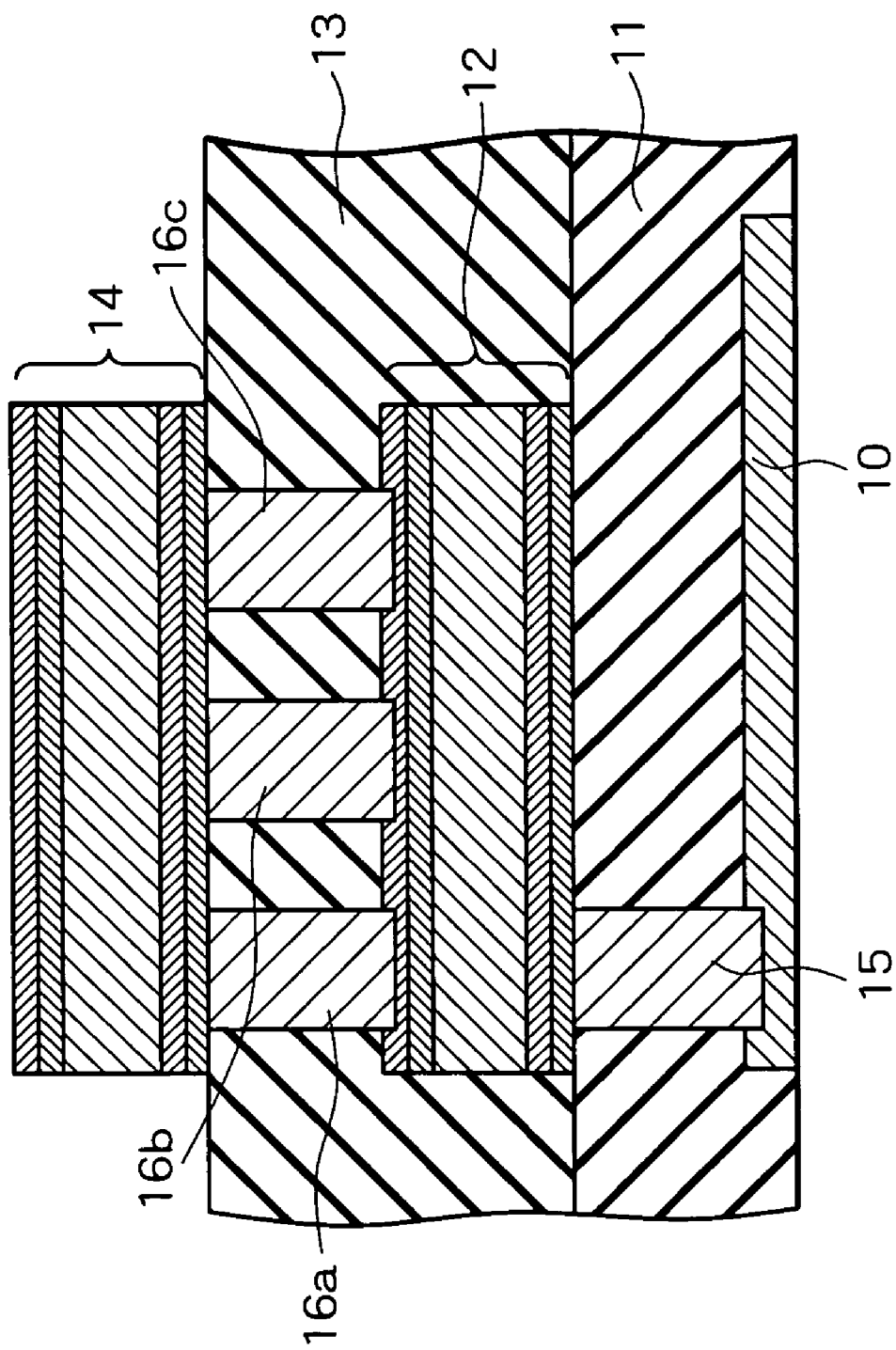
FIG. 5 is a view showing a sectional structure of a semiconductor device with a multilayer interconnection structure according to a first preferred embodiment of the invention.

Hereinafter, the present invention will be described based on a first preferred embodiment. FIG. 5 is a sectional view showing a semiconductor device according to the first embodiment.

The semiconductor device according to the present embodiment has a structure of a gate electrode 10, a first interlayer insulation film 11, a first metal wiring 12 (a wiring of the first metal wiring layer in the Claims), a second interlayer insulation film 13, and a second metal wiring 14 (a wiring of the second metal wiring layer in the Claims) laminated in order. The gate electrode 10 and first metal wiring 12 are electrically connected by a contact 15. In addition, the first metal wiring 12 and second metal wiring 14 are electrically connected by via holes 16 (16a to 16c).

As described above, in the semiconductor device with a multilayer structure, when the via holes 16 (16a to 16c) are formed on metal wiring (first metal wiring 12) communicated with the gate electrode 10, a high resistance layer is formed in some cases if an electrode capacitance value (capacitance value between the gate electrode 10 and unillustrated semiconductor substrate) per unit area of the via holes 16 exceeds a predetermined value. The greater the electric capacitance (hereinafter, the electric capacitance between the gate electrode and unillustrated semiconductor can be simply expressed as an electrode capacitance of the gate electrode) is (the greater the electrode capacitance value of the gate electrode 10 is, and the smaller the total of sectional areas of the via holes 16 is), the more easily the high resistance layer is created.

Figure 6:
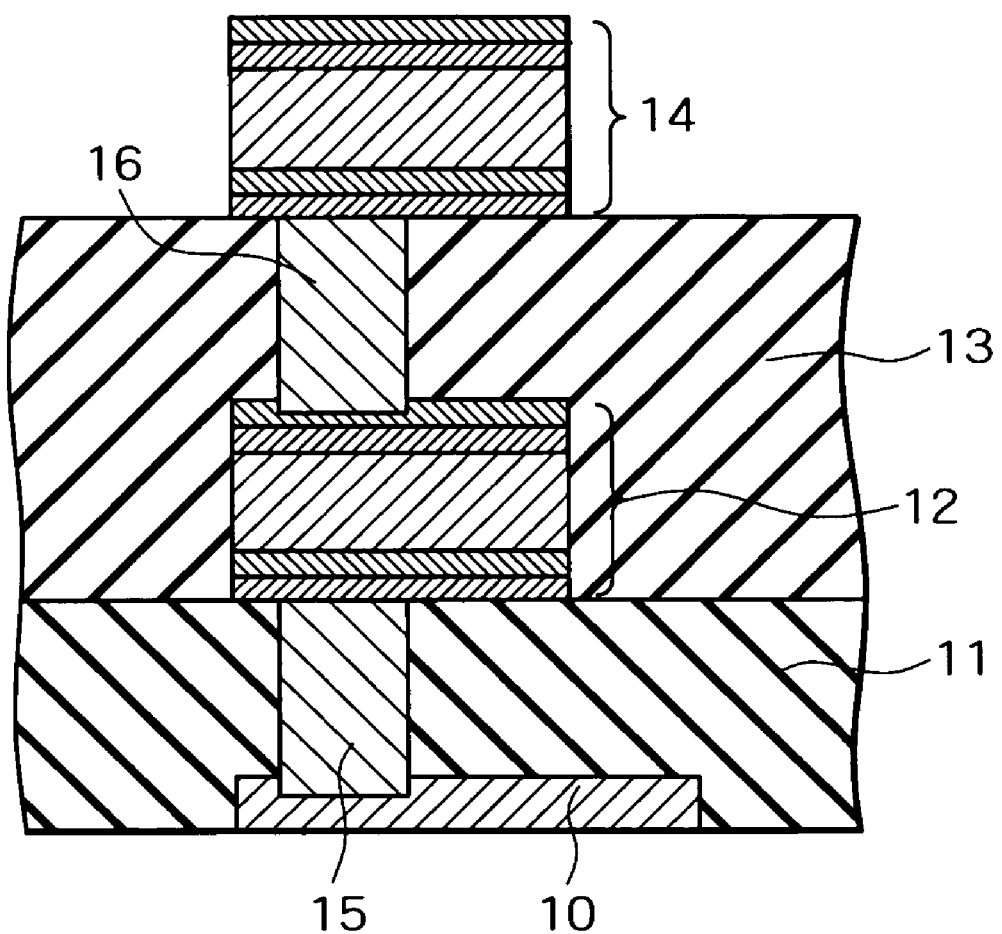
FIG. 6 is a view showing a sectional structure of a semiconductor device with a multilayer interconnection structure where the value of electrode capacitance per via unit area is great.

For example, as shown in FIG. 6, in a case where the first metal wiring 12 and second metal wiring 14 are to be connected by a single via 16, there is no problem if the electrode capacitance value of the gate electrode 10 is small, however, if the electrode capacitance value of the gate electrode 10 increases, a high resistance layer may be created on the surface layer of an upper barrier metal of the first metal wiring 12.

Therefore, in the semiconductor device of the present embodiment shown in FIG. 5, the number of via holes 16 is set so that a value obtained by dividing electrode capacitance of the gate electrode 10 by the number of via holes 16 is a predetermined value or less. Namely, the total of the sectional areas of the via holes 16 is set large.

Thereby, when the via holes 16 are formed, creation of a high resistance layer on the surface layer of the upper barrier metal is eliminated, and conduction between the first metal wiring (lower-layer wiring) 12 and second metal wiring (upper-layer wiring) 14 is secured.

Accordingly, not merely can an electric current bypass be secured, when any of the via holes 16a to 16c fails in conduction, by way of another via, occurrence of a conduction failure itself is reduced.

As such, in the semiconductor device with a multilayer interconnection structure according to the present embodiment, the upper wiring and lower wiring are connected by via holes formed with conditions not to create a high resistance layer, the possibility of conduction failure is low, and a high reliability is provided.

Second Embodiment

Figure 7:
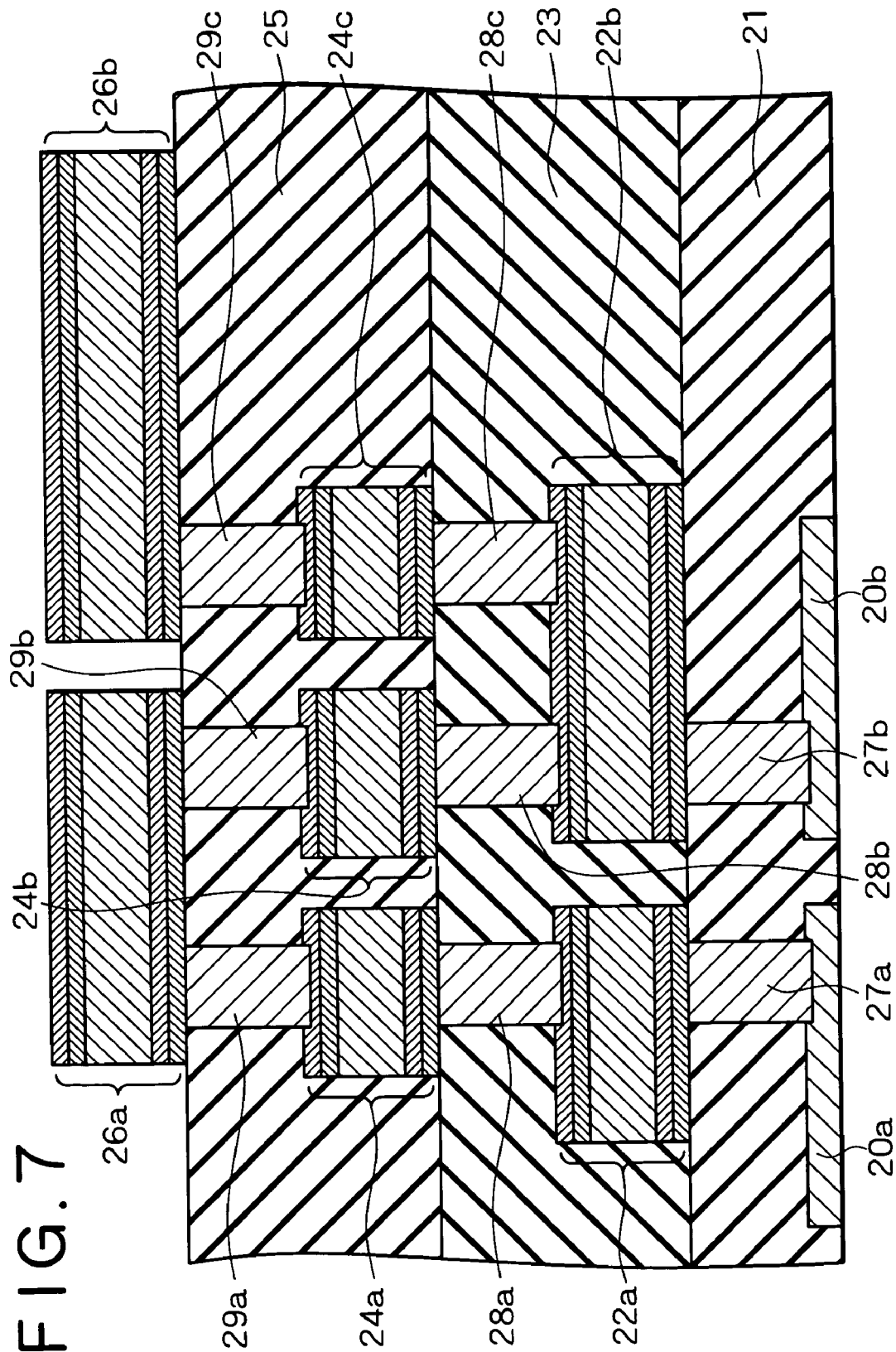
FIG. 7 is a view showing a sectional structure of a semiconductor device with a multilayer interconnection structure according to a second preferred embodiment of the present invention.

Next, the present invention will be described based on a second preferred embodiment. FIG. 7 is a sectional view showing a semiconductor device with a multilayer interconnection structure according to the second embodiment. In this semiconductor device, a first interlayer insulation film 21 is formed on a semiconductor substrate including on gate electrodes 20 (20a and 20b), and on the first interlayer insulation film 21, a first metal wiring (a wiring of the first metal wiring layer in the Claims) 22 (22a and 22b) is formed. And, on the first interlayer insulation film 21 including on this first metal wiring 22, a second interlayer insulation film 23 is formed. And, on the second interlayer insulation film 23, a second metal wiring (a wiring of the second metal wiring layer in the Claims) 24 (24a and 24b) is formed. And, on the second interlayer insulation film 23 including on this second metal wiring 24, a third interlayer insulation film 25 is formed. On this third interlayer insulation film 25, a third metal wiring (a wiring of the third metal wiring layer in the Claims) 26 (26a and 26b) is formed. In such a manner, on the substrate including gate electrodes 20, the three layers of metal wiring 22, 24, and 26 are laminated while being mutually insulated by the interlayer insulation films 21, 23, and 25.

The gate electrode 20a and first metal wiring 22a are electrically connected via a contact 27a formed in the first interlayer insulation film 21. In addition, the gate electrode 20b and first metal wiring 22b are similarly electrically connected via a contact 27b formed in the first interlayer insulation film 21.

The first metal wiring 22a is electrically connected to the second metal wiring 24a via a first via 28a formed in the second interlayer insulation film 23. In addition, the first metal wiring 22b is electrically connected to the second metal wiring 24b via a first via 28b formed in the second interlayer insulation film 23, and similarly, this is also electrically connected to the third metal wiring 24c via a first via 28c formed in the second interlayer insulation film 23.

The second metal wiring 24a is electrically connected to the third metal wiring 26a via a second via 29a formed in the third interlayer insulation film 25. In addition, the second metal wiring 24b is electrically connected to the third metal wiring 26a via a second via 29b formed in the third interlayer insulation film 25. Furthermore, the second metal wiring 24c is electrically connected to the third metal wiring 26b via a second via 29c formed in the third interlayer insulation film 25.

Figure 8:
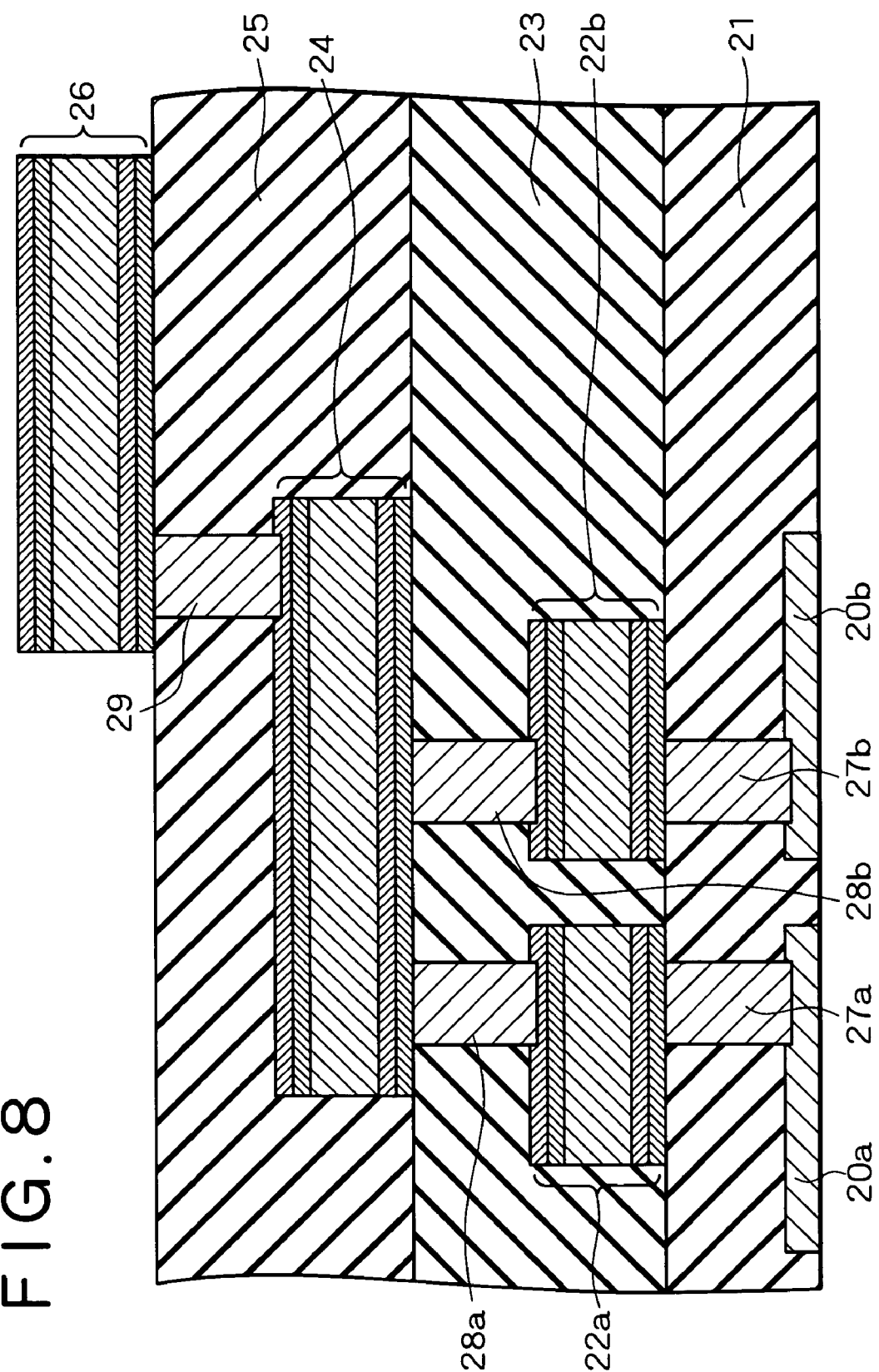
FIG. 8 is a view showing a sectional structure where electrode capacitance per unit area of a via formed on metal wiring where electric currents from divided gate electrodes merge increases.

In a semiconductor device whose gate electrode 20 has been divided into a plurality of pieces (20a and 20b) as shown in FIG. 8, the first via 28a receives only an influence of electric charge accumulated in the first gate electrode 20a, and the first via 28b receives only an influence of electric charge accumulated in the first gate electrode 20b.

However, when a second via 29 is formed on the second metal wiring 24 to be a confluence of electric currents from the plurality of gate electrodes, since the second metal wiring 24 is conductive with both of the gate electrodes 20a and 20b, influences of electric charges accumulated in both electrodes are overlapped. Therefore, even if no high resistance layer is created at the time of a first via formation, there is a possibility that an electrode capacitance value per unit area exceeds a predetermined value at the time of a second via formation and a high resistance layer is created.

Herein, it is supposed that each of the first gate electrodes 20a and 20b has an electric capacitance of 5 pF between the same and unillustrated semiconductor substrate, sectional areas of the respective via holes are the same, and there is a possibility that a high resistance layer is created on the front layer of an upper barrier metal when an electrode capacitance per one via exceeds 8 pF. In this case, at the time where the first via holes 28a and 28b are formed, no high resistance layer is created on the surface layer of an upper barrier metal of the first metal wiring 22a and 22b. However, when the second via 29 is formed on the second metal wiring 24, since the second metal wiring 24 is substantially connected with the gate electrodes 20a and 20b having a capacitance of 10 pF in total, a high resistance layer is formed thereon.

Figure 9:
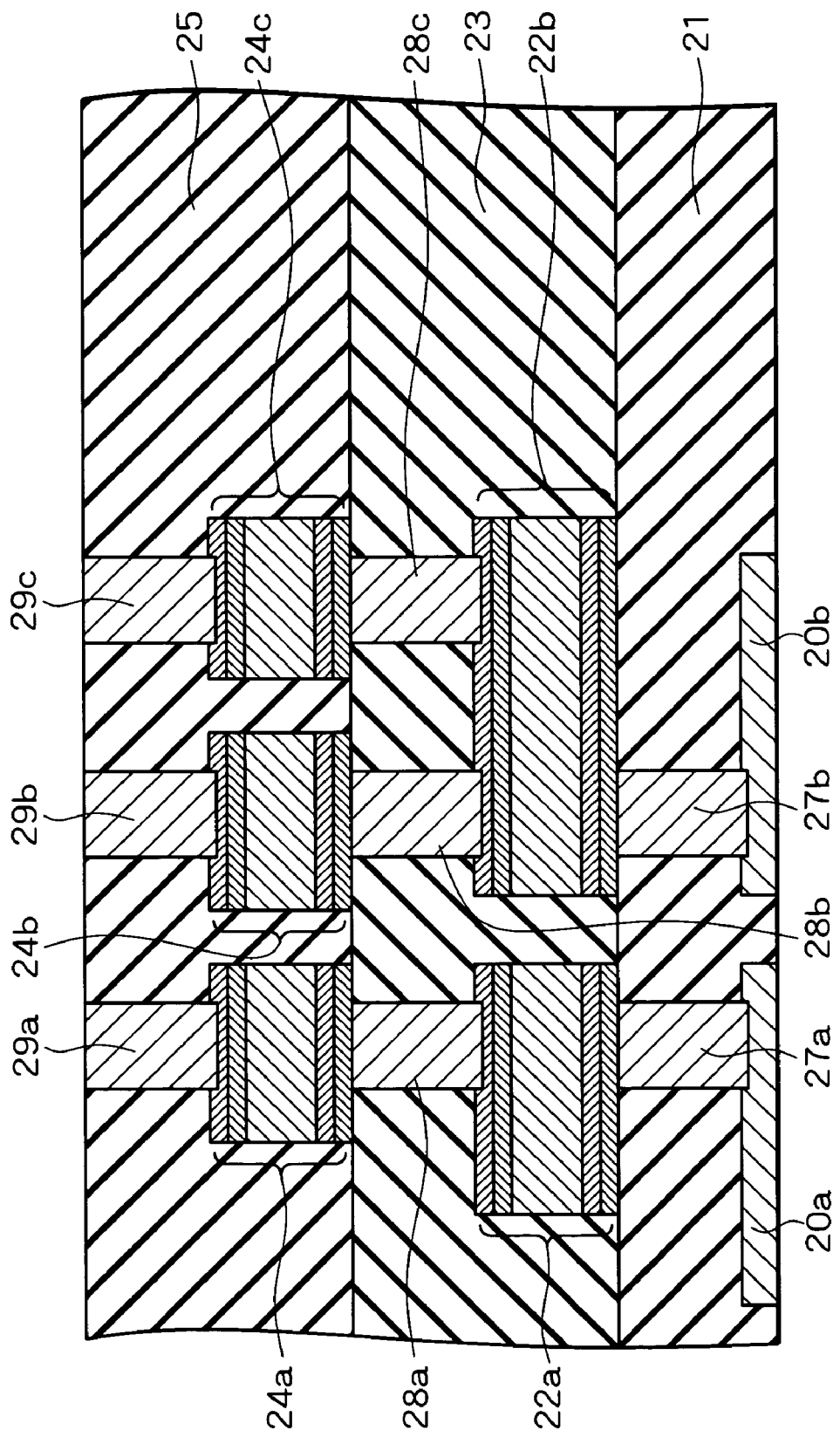
FIG. 9 is a view showing, in the semiconductor device with a multilayer interconnection structure according to the second embodiment, a construction immediately before the divided gate electrodes are electrically connected to each other.

In the semiconductor device according to the present embodiment, as shown in FIG. 7 and FIG. 9, the gate electrode 20a and the gate electrode 20b are electrically insulated from the point in time where the second via 29 is formed. And, it is not until the third metal wiring 26 (unillustrated in FIG. 9) is formed that the gate electrode 20a and gate electrode 20b are electrically connected. Therefore, in either case of via formation, the metal wiring never receives overlapping influences of electric charges accumulated in the plurality of gate electrodes 20a and 20b, respectively, and no high resistance layer is formed.

As such, for the respective via holes of the semiconductor device according to the present embodiment, a total electrode capacitance of gate electrodes connected when the same is formed is provided as not more than a predetermined amount. Therefore, no high resistance layer is formed at the time of via formation. Accordingly, an electrical connection between the wirings of the upper wiring and lower wiring layer is secured.

Third Embodiment

Figure 10:
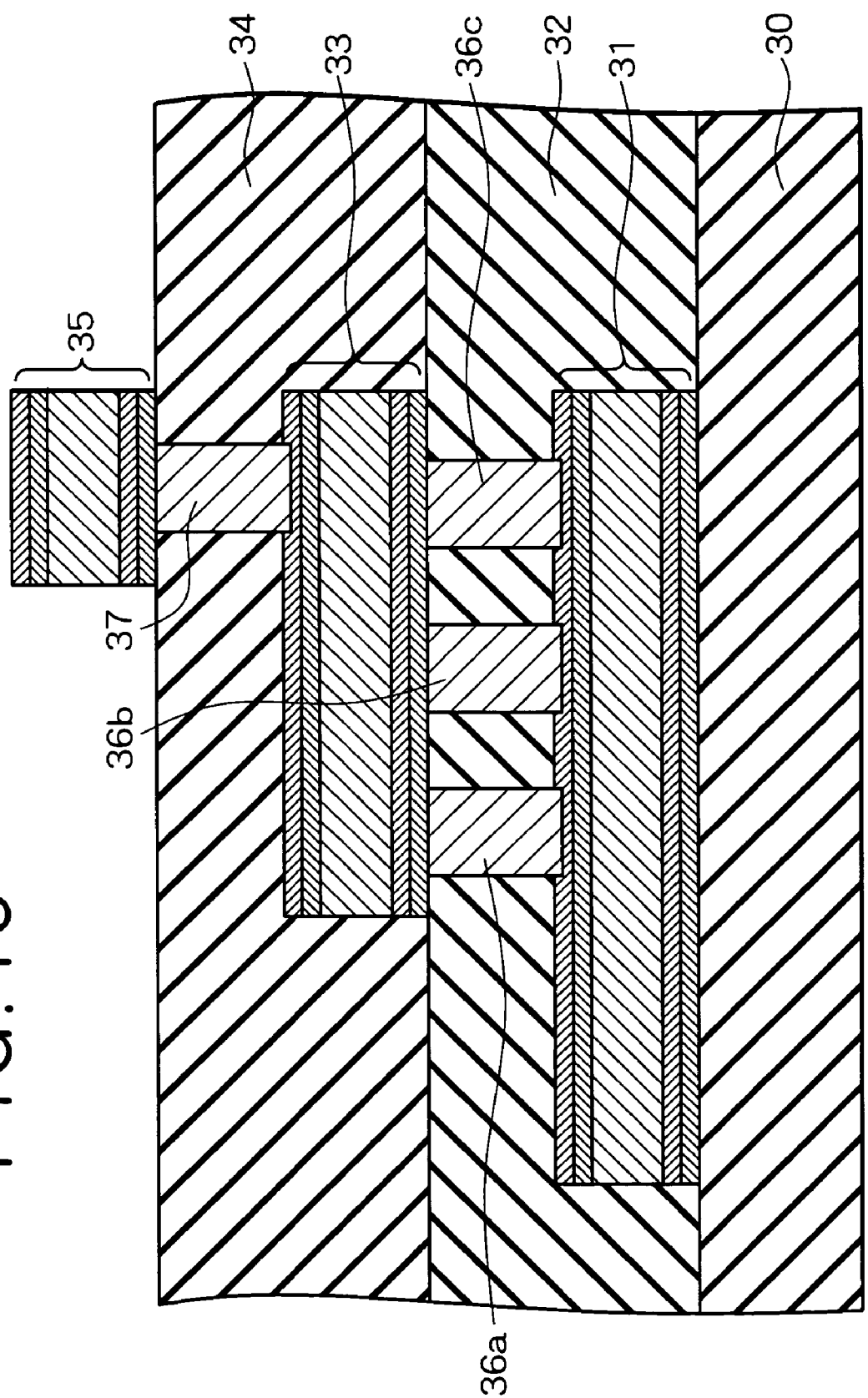
FIG. 10 is a view showing a sectional structure of a semiconductor device with a multilayer interconnection structure according to a third preferred embodiment of the present invention.

Next, a third embodiment of the present invention will be described. FIG. 10 is a sectional view showing a semiconductor device with a multilayer interconnection structure according to the third embodiment. This semiconductor device has a structure of a first metal wiring (a metal wiring of a first layer of the Claims) 31, a first interlayer insulation film 32, a second metal wiring (a metal wiring of a second layer of the Claims) 33, a second interlayer insulation film 34, and a third metal wiring (a third metal wiring layer in the Claims) 35 laminated in this order on a lower-layer interlayer insulation film 30.

The first metal wiring 31 is a metal wiring in a floating state not connected to any of the grounds or gate electrodes, and is electrically connected with the second metal wiring 33 via first via holes 36 (36a to 36c) formed on the first interlayer insulation film 32. The second metal wiring 33 is electrically connected with the third metal wiring 35 via a second via 37 formed on the second interlayer insulation film 34.

Electric capacitance of metal wiring in a floating state is proportional to the area thereof. And, as described above, a high resistance layer is created on the lower-layer metal wiring if the area of metal wiring in a floating state per via unit area (if sectional areas of the via holes are uniform, the area of metal wiring in a floating state per one via) is greater than a predetermined value, and this can cause a conduction failure between the metal wiring.

Figure 11:
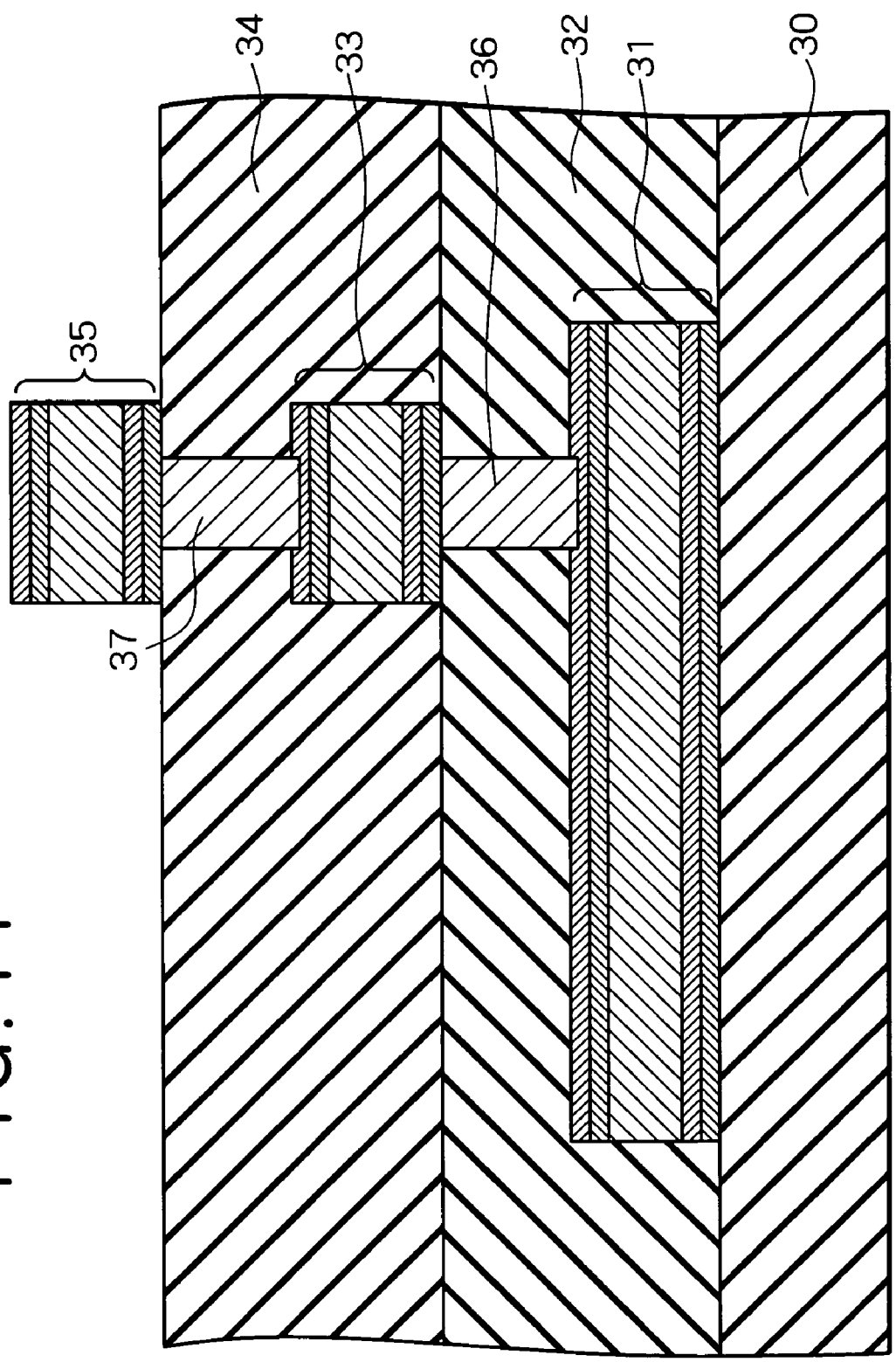
FIG. 11 is a view showing a sectional structure of a semiconductor device with a multilayer interconnection structure where the area of metal wiring in a floating state per via unit area is great.

For example, as shown in FIG. 11, in a case where a via hole (first via hole 36) to connect metal wiring (first metal wiring 31) in a floating state and upper-layer metal wiring (second metal wiring 33) are formed, there is no problem if the area of the first metal wiring 31 is small, however, if the first metal wiring 31 increases, a high resistance layer may be created on the surface layer of the first metal wiring 31.

Therefore, in the semiconductor device of the present embodiment shown in FIG. 10, the number of via holes 36 (36a, 36b, and 36c) is set so that a value obtained by dividing the area of the first metal wiring 31 in a floating state by the number of via holes 36 (36a, 36b, and 36c), that is, an area of the metal wiring in a floating state per one via is a predetermined value or less. Namely, the total of the sectional areas of the via holes 36 (36a, 36b, and 36c) is set large.

Thereby, when the via holes 36 (36a, 36b, and 36c) to connect the metal wiring 31 in a floating state and the metal wiring 33 positioned thereabove are formed, creation of a high resistance layer can be prevented.

Here, for the via hole formed not directly on the metal wiring in a floating state (second via hole 37 electrically connecting the second metal wiring 33 and third metal wiring 35), since no high resistance layer is formed irrespective of a total value of electric capacitance of the connected metal wiring, this never causes a conduction failure between the upper and lower wiring.

Therefore, in the semiconductor device according to the present embodiment, conduction between the lower metal wiring 31 and the upper metal wiring 33 is hardly lost, and high reliability is shown.

Here, the above-described embodiments are merely examples of preferred embodiments of the present invention, and the present invention is not limited hereto.

For example, in the first embodiment, although a structure example wherein an electric capacitance per one via is made a predetermined value or less by forming three via holes between the wirings of the first metal wiring layer and second metal wiring layer has been shown, it is sufficient that an electrode capacitance per unit area can be made a predetermined value or less, and the number of via holes is not limited hereto.

Figure 12:
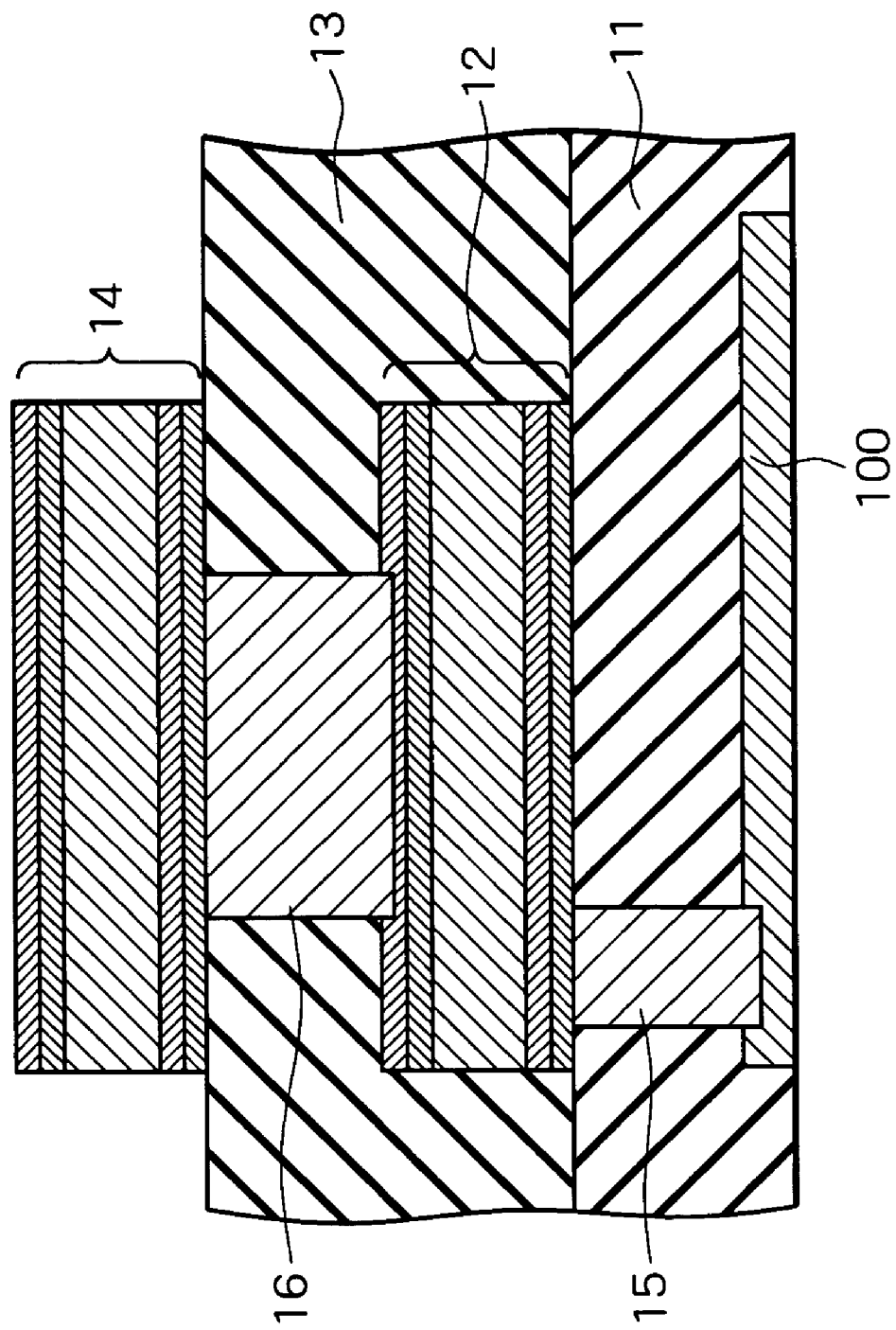
FIG. 12 is a view showing a sectional structure of a semiconductor device with a multilayer interconnection structure where wiring capacitance per via unit area has been reduced by enlarging the sectional area of the via.

In addition, all via holes are not necessarily in an identical shape. For example, if a high resistance layer may be created on the front layer of an upper barrier metal of the first metal wiring 12 in the construction shown in FIG. 6, a wiring capacitance per via unit area (or area of the metal wiring in a floating condition) may be reduced by widening the via 16 in the sectional area as shown in FIG. 12.

As such, the present invention can be variously modified.

What is claimed is:

1. A semiconductor device with a multilayer interconnection structure comprising:
   a semiconductor substrate;
   a plurality of metal wiring layers provided on the semiconductor substrate and electrically insulated from upper and lower metal wiring layers by an interlayer insulation film; and
   at least one via penetrating through the interlayer insulation film and connecting a wiring of a first metal wiring layer and a wiring of a second metal wiring layer positioned above the first metal wiring layer,
   wherein a potential of a predetermined wiring of the first metal wiring layer is electrically floating from the semiconductor substrate,
   wherein a capacitance value between the predetermined wiring of the first metal wiring layer and the semiconductor substrate per one via provided on the predetermined wiring of the first metal wiring layer is a predetermined value or less, and
   wherein the predetermined value is 8pF.

2. The semiconductor device with a multilayer interconnection structure as set forth in claim 1,
   wherein the predetermined wiring of the first metal wiring layer is connected to a gate electrode, and the predetermined value is almost equal to a capacitance value between the gate electrode and semiconductor substrate per one via provided on the predetermined wiring of the first metal wiring layer.

3. The semiconductor device with a multilayer interconnection structure as set forth in claim 2,
   wherein the predetermined value is a value to reduce via conduction failure.

4. The semiconductor device with a multilayer interconnection structure as set forth in claim 2,
   wherein a wiring of a third metal wiring layer is further provided on the wiring of the second metal wiring layer via an interlayer insulation film,
   wherein the wiring of the second metal wiring layer and the wiring of the third metal wiring layer are connected by at least one second via,
   wherein predetermined wiring of the second metal wiring layer is connected to only predetermined wiring of the first metal wiring layer connected to a gate electrode, and
   wherein a capacitance value between the gate electrode connected by the wiring of the first metal wiring layer to the predetermined wiring of the second metal wiring layer and semiconductor substrate per one second via provided on the predetermined wiring of the second metal wiring layer is the predetermined value or less.

5. The semiconductor device with a multilayer interconnection structure as set forth in claim 4,
   wherein the predetermined value is a value to reduce via conduction failure.

6. The semiconductor device with a multilayer interconnection structure as set forth in claim 4, wherein the wiring of the first metal wiring layer has a first barrier metal at a top thereof, and the wiring of the second metal wiring layer has a second barrier metal at a top thereof.

7. The semiconductor device with a multilayer interconnection structure as set forth in claim 6, wherein a first via and the wiring of the first metal wiring layer are connected via the first barrier metal, and a second via and the wiring of the second metal wiring layer are connected via the second barrier metal.

8. The semiconductor device with a multilayer interconnection structure as set forth in claim 2, wherein the gate electrode and the first metal wiring are electrically connected via a contact fanned in an insulation film.

9. The semiconductor device with a multilayer interconnection structure as set forth in claim 2, wherein the gate electrode comprises a plurality of electrically isolated sub-gate electrodes.

10. The semiconductor device with a multilayer interconnection structure as set forth in claim 9, wherein each of said plurality of electrically isolated sub-gate electrodes is connected to the first metal wiring via a contact formed in an insulation film.

11. The semiconductor device with a multilayer interconnection structure as set forth in claim 1, wherein
    the predetermined wiring of the first metal wiring layer is connected to only the via for a connection to the wiring of the second metal wiring layer, the predetermined value is dominated by an area of the predetermined wiring of the first metal wiring layer per one via provided on the predetermined wiring of the first metal wiring layer per one via provided on the predetermined wiring of the first metal wiring layer, and the area of the predetermined wiring of the first metal wiring layer per one via provided on the predetermined wiring of the first metal wiring layer is a predetermined value or less.

12. The semiconductor device with a multilayer interconnection structure as set forth in claim 11, wherein the predetermined value is 2500 µm$^2$.

13. The semiconductor device with a multilayer interconnection structure as set forth in claim 11, wherein the predetermined value is a value to reduce via conduction failure.

14. The semiconductor device with a multilayer interconnection as set forth in claim 1, wherein the wiring of the first metal wiring layer has a barrier metal at a top thereof.

15. The semiconductor device with a multilayer interconnection structure as set forth in claim 14, wherein the via and the wiring of the first metal wiring layer are connected via the barrier metal.

16. The semiconductor device with a multilayer interconnection structure as set forth in claim 1, wherein a number of via holes is set so that the capacitance value between the gate electrode and semiconductor substrate per one via does not exceed 8pF.

17. The semiconductor device with a multilayer interconnection structure as set forth in claim 1, wherein the predetermined value is determined by an area of the predetermined wiring of the first metal wiring layer per one via provided on the predetermined wiring of the first metal wiring layer.

* * * * *